(12) United States Patent
Wu (10) Patent No.: US 9,671,554 B2
(45) Date of Patent: Jun. 6, 2017

(54) APPARATUS FOR COMPENSATING IMAGE OF DISPLAY AND DISPLAY ASSEMBLY

(71) Applicant: Ye Xin Technology Consulting Co., Ltd., Hsinchu (TW)

(72) Inventor: I-Wei Wu, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 201 days.

(21) Appl. No.: 14/499,553

(22) Filed: Sep. 29, 2014

(65) Prior Publication Data

US 2015/0093087 A1 Apr. 2, 2015

(30) Foreign Application Priority Data

Sep. 27, 2013 (TW) .............................. 102135212 A (51) Int. Cl.
  *G02B 6/10* (2006.01)
  *G02F 1/1335* (2006.01)
  *H01L 51/52* (2006.01)
  *H01L 27/32* (2006.01)
  *G02F 1/1333* (2006.01)

(52) U.S. Cl.
  CPC ......... *G02B 6/10* (2013.01); *G02F 1/133524* (2013.01); *H01L 51/5262* (2013.01); *G02F 2001/133388* (2013.01); *G02F 2001/133562* (2013.01); *H01L 27/3237* (2013.01)

(58) Field of Classification Search
None
See application file for complete search history.

(56) References Cited

U.S. PATENT DOCUMENTS

| 4,747,862 A | * | 5/1988 | Haisma | C03B 23/207 65/410 |
| 6,927,908 B2 | * | 8/2005 | Stark | G02F 1/13336 345/1.3 |
| 2011/0025594 A1 | * | 2/2011 | Watanabe | G02F 1/13336 345/102 |
| 2014/0037257 A1 | * | 2/2014 | Yang | G02B 6/0078 385/116 |

FOREIGN PATENT DOCUMENTS

CN 101965604 A 2/2011

* cited by examiner

*Primary Examiner* — Chad Smith
(74) *Attorney, Agent, or Firm* — Steven Reiss (57) ABSTRACT

An image compensating portion located on a display panel includes a light incident surface, a light emitting surface, and a plurality of light guiding channels parallel with each other. The display panel includes a main display region and a periphery display region. A projection of the light emitting surface on the light incident surface is larger than an area of the light incident surface. The light guiding channel guides lights from the light incident surface to be emitted from the light emitting surface for being extended.

15 Claims, 11 Drawing Sheets

APPARATUS FOR COMPENSATING IMAGE OF DISPLAY AND DISPLAY ASSEMBLY

CROSS-REFERENCE TO RELATED APPLICATIONS

This application is related to a U.S. patent application Ser. No. 14/546,171 and entitled "APPARATUS FOR COMPENSATING IMAGE OF DISPLAY AND DISPLAY ASSEMBLY", U.S. patent application Ser. No. 14/164,118 filed on Jan. 24, 2014, entitled "DISPLAY DEVICE, JOINT DISPLAY AND BACKLIGHT MODULE"; U.S. patent application Ser. No. 14/164,139 filed on Jan. 25, 2014, entitled "APPARATUS FOR COMPENSATING IMAGE OF DISPLAY AND METHOD FOR MANUFACTURING SAME"; U.S. patent application Ser. No. 14/164,140 filed on Jan. 25, 2014, entitled "APPARATUS FOR COMPENSATING IMAGE OF DISPLAY AND METHOD FOR MANUFACTURING SAME"; U.S. patent application Ser. No. 14/164,136 filed on Jan. 25, 2014, entitled "APPARATUS FOR COMPENSATING IMAGE OF DISPLAY, DISPLAY AND JOINT DISPLAY"; and U.S. patent application Ser. No. 14/164,137 filed on Jan. 25, 2014, entitled "DISPLAY ELEMENT, DISPLAY DEVICE AND JOINT DISPLAY". This application claims priority to Taiwan Patent Application No. 102135212 filed on Sep. 27, 2013, the contents of which are incorporated by reference herein.

FIELD

The present disclosure relates to an image compensating apparatus disposed upon a display panel.

BACKGROUND

In order to obtain a display panel of a relative large size, it may be manufactured by a large number of serialization displays jointed together in a plane. The borders between two adjacent display panels jointing together is non-visible.

BRIEF DESCRIPTION OF THE FIGURES

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The present disclosure is described in relation to a display with a zero border.

Figure 1:
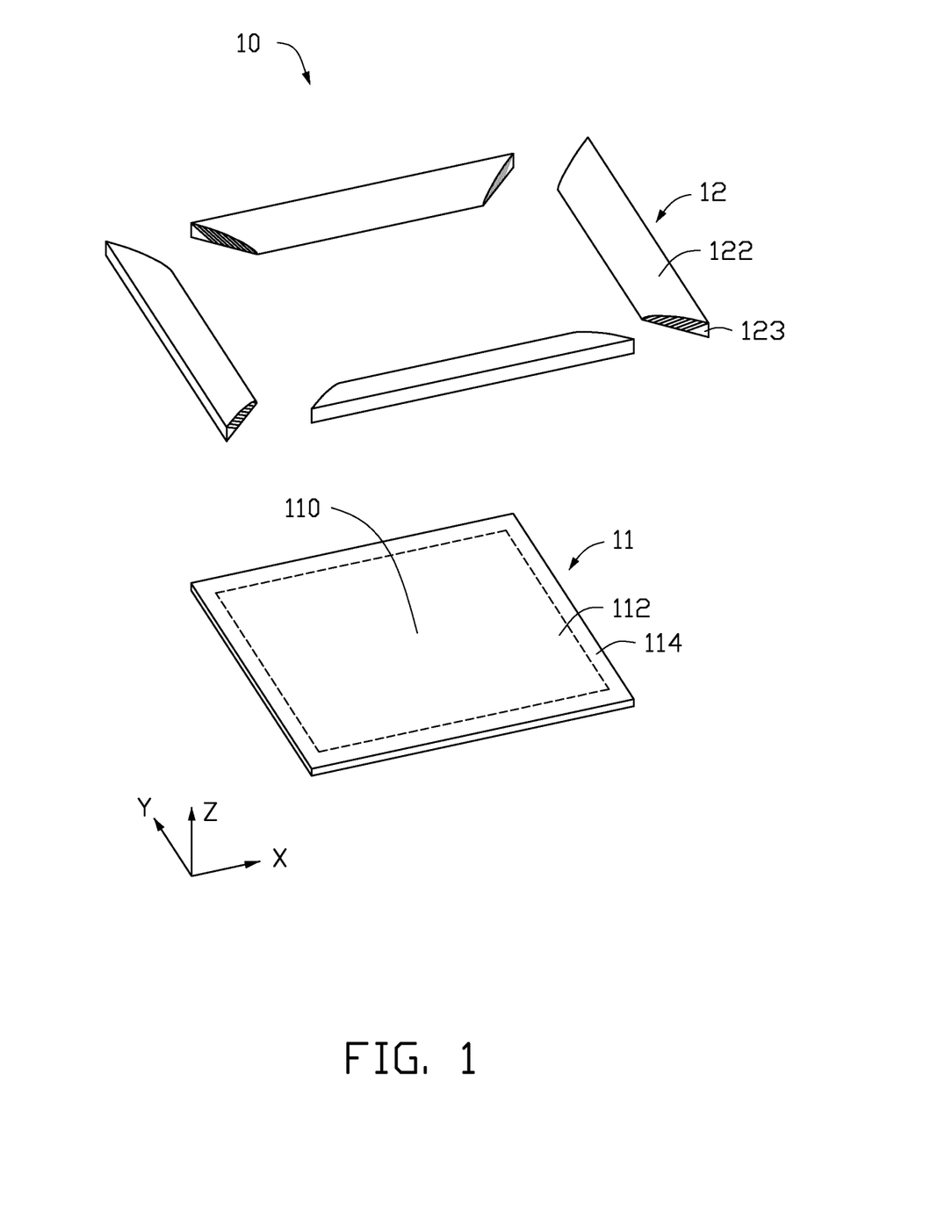
FIG. 1 is a partially exploded view of an embodiment of a display, the display including an image compensating apparatus.
Figure 2:
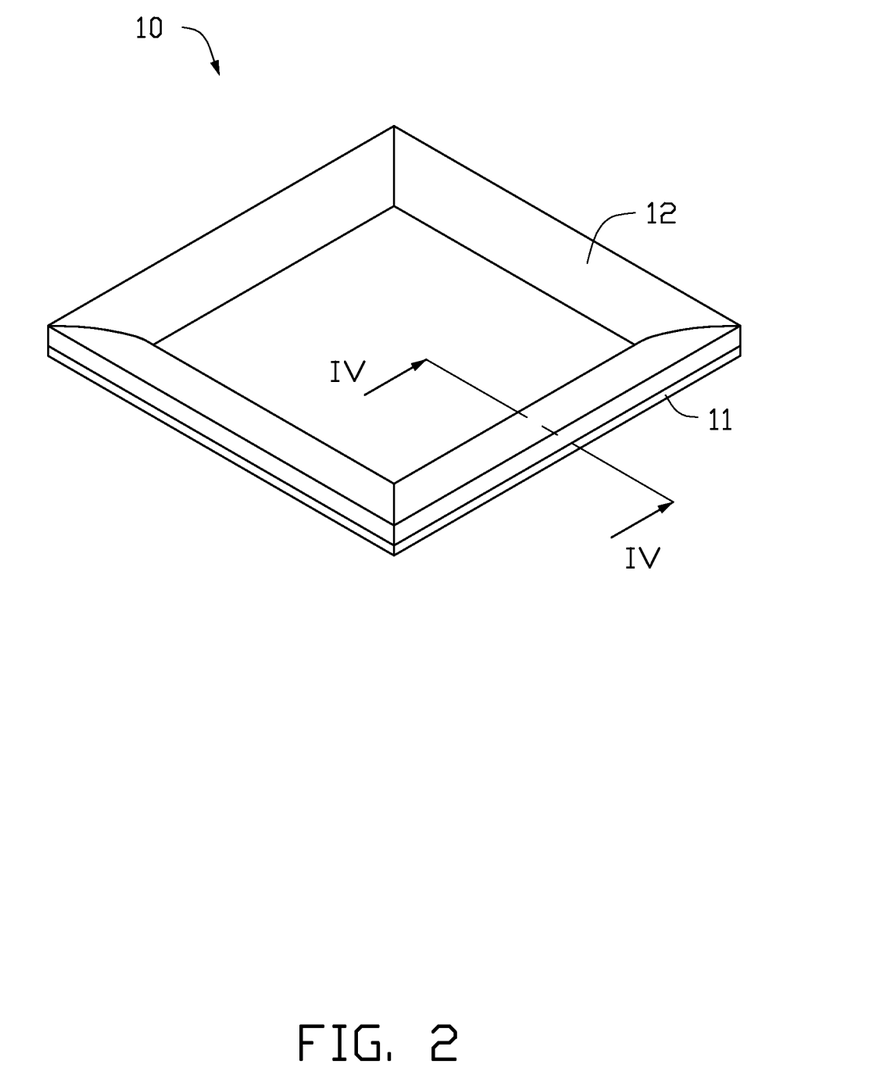
FIG. 2 is an assembled isometric view of an embodiment of the display of FIG. 1.

FIGS. 1-2 illustrate an embodiment of a display 10. The display 10 includes a display panel 11 and an image compensating apparatus 12 located on the display panel 11. In at least one embodiment, the display panel 11 is a liquid crystal display (LCD) panel or an organic light emitting display (OLED) panel.

The display panel 11 includes a main display region 110, a periphery display region 112 located at one side of the main display region 110, and a non-display region 114 outside the periphery display region 112. In at least one embodiment, the non-display region 114 is a border of the display 10.

Figure 3:
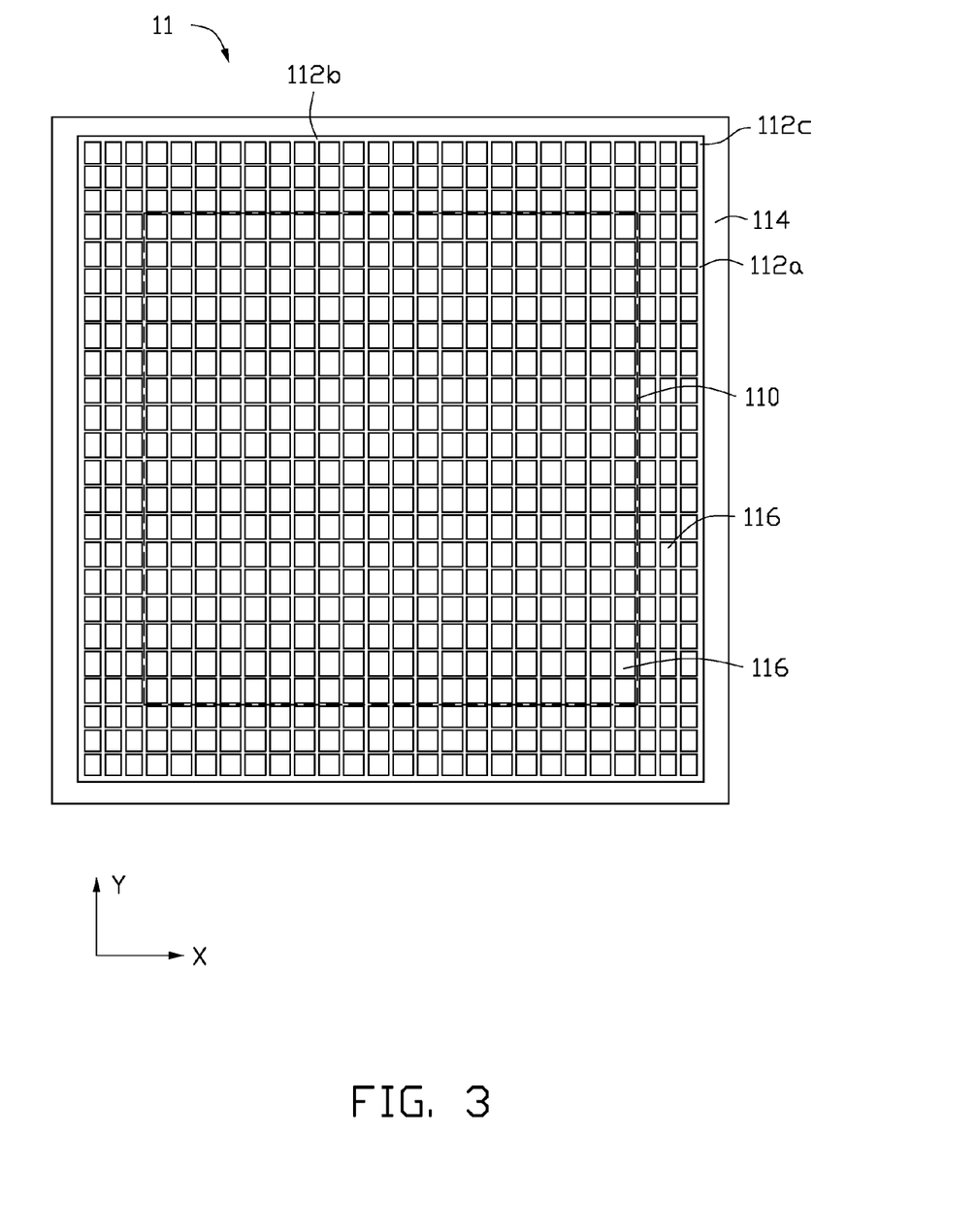
FIG. 3 is a diagrammatic view of an embodiment of the display of FIG. 1.

FIG. 3 illustrates that the main display region 110 and the periphery display region 112 include a plurality of pixels 116 arranged as a matrix. Areas of the pixels 116 in the main display region 110 are constant, and each of adjacent pixels 116 in the main display region 110 are spaced in a first distance. Moreover, areas of the pixels 116 in the periphery display region 112 are constant, and each of adjacent pixels 116 in the periphery display region 112 are spaced in a second distance. A pixel density of the main display region 110 is less than a pixel density of the periphery display region 112. The first distance is greater than the second distance, and the constant area of the pixel 116 in the main display region 110 is greater than the constant area of the pixel 116 in the periphery display region 112. A length of the pixel 116 in the main display region 110 is greater than a length of the pixel 116 in the periphery display region 112, and a width of the pixel 116 in the main display region 110 is greater than a width of the pixel 116 in the periphery display region 112. The length of the pixel 116 is parallel with a direction X, and the width of the pixel 116 is parallel with the direction Y perpendicular to the direction X. In at least one embodiment, widths of the pixel 116 in the periphery display regions 112a located on a right side and a left side of the main display region 110 are constant. A length of the pixel 116 in the periphery display region 112a is equal to a length of the pixel 116 in the main display region 110, a width of the pixel 116 in the periphery display region 112a is less than a width of the pixel 116 in the main display region 110. Lengths of the pixels 116 in the periphery display regions 112b located on an upper side and a lower side of the main display region 110 are constant. A width of the pixel 116 in the periphery display region 112b is equal to a width of the pixel 116 in the main display region 110, a length of the pixel 116 in the periphery display region 112b is less than a length of the pixel 116 in the main display region 110. A length of the pixel 116 in the periphery display regions 112c located at corners is less than a length of the pixel 116 in the main display region 110, and a width of the pixel 116 in the periphery display regions 112c is less than a width of the pixel 116 in the main display region 110. A length of the pixel 116 in the periphery display region 112c is equal to a length of the pixel 116 in the periphery display region 112a, and a width of the pixel 116 in the periphery display region 112c is equal to a width of the pixel 116 in the periphery display region 112b.

Figure 4:
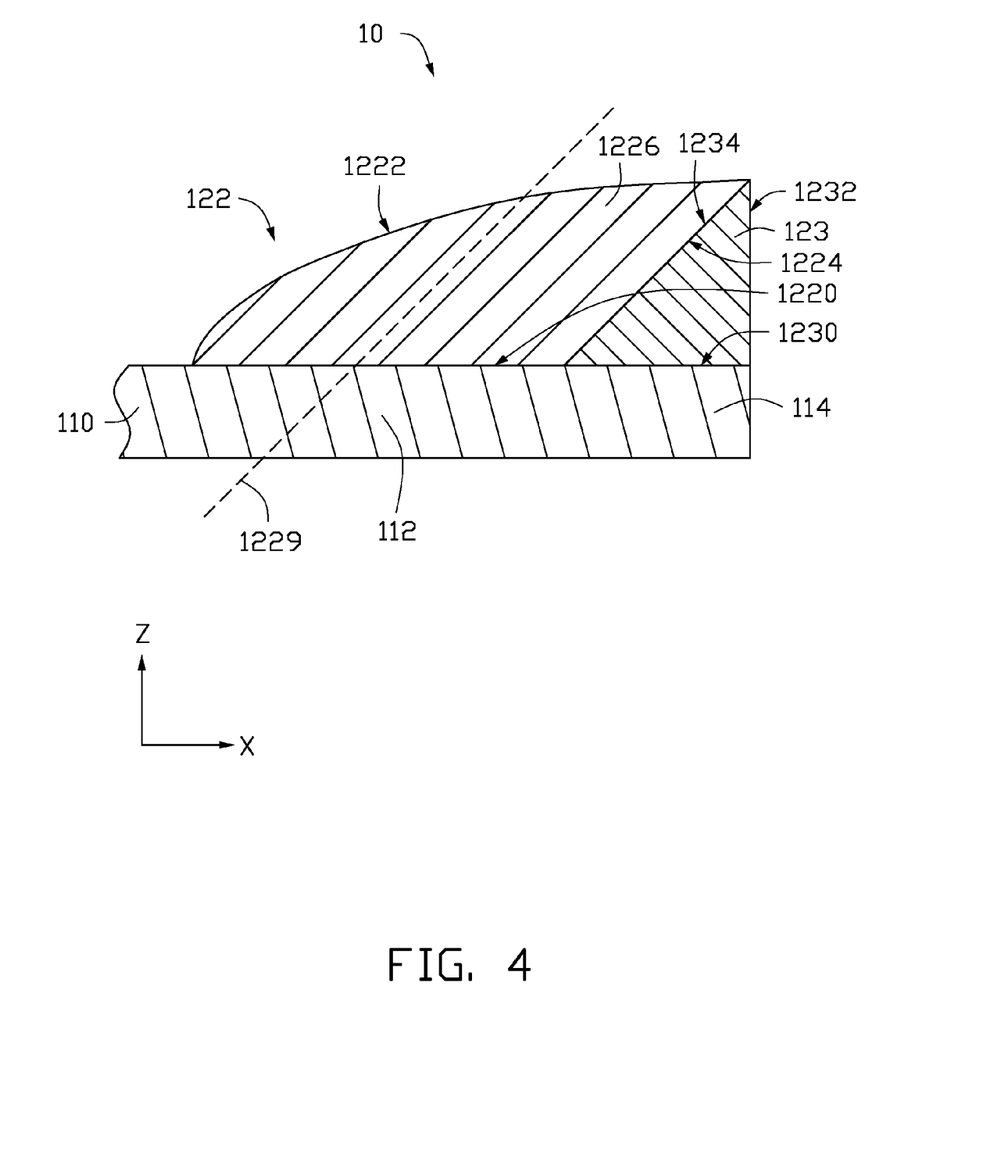
FIG. 4 is a cross-sectional view of an embodiment of the display of FIG. 2, taken along a line IV-IV thereof, the display including a light guiding channel.

FIG. 4 illustrates that the image compensating apparatus 12 includes four image compensating portions 122 set on the periphery display region 112 and four supporting portions 123 set on the non-display region 114. The image compensating portions 122 and the supporting portions 123 cooperatively define a hollow rectangular frame. The image compensating portion 122 extends an image displayed on edges of the periphery display region 112 to the non-display region 114. A cross section of the image compensating portion 122 is substantially arc shaped. The supporting portion 123 supports the connected image compensating portion 122.

The image compensating portion 122 includes a light incident surface 1220 resisting with the periphery display region 112, a light emitting surface 1222 connected to the light incident surface 1220, and an inclined surface 1224 connected between the light incident surface 1220 and the light emitting surface 1222. The light emitting surface 1222 is substantially arc shaped and protrudes outwardly away from the light incident surface 1220. A projection area of the light emitting surface 1222 on the light incident surface 1220 is greater than an area of the light incident surface 1220. The inclined surface 1224 resists the corresponding supporting portion 123, and is located on a side of the image compensating portion 122 away from the main display region 110. The inclined surface 1224 and the light incident surface 1220 define an obtuse angle, which is within a range of 130 degrees to 150 degrees. In at least one embodiment, the obtuse angle is 135 degrees.

The image compensating portion 122 further includes a plurality of light guiding channels 1226 parallel with each other. The light guiding channel 1226 extends from the light incident surface 1220 to the light emitting surface 1222 along a predetermined direction. The light guiding channel 1226 guides light from the light incident surface 1220 to be emitted from the light emitting surface 1222 for extending an image covering region of the periphery display region 112 while working. Sidewalls of different light guiding channels 1226 are connected with each other to form the image compensating portion 122. Cross-sectional areas of each of the light guiding channels 1226 are constant, which means the diameter of each of the light guiding channels 1226 is constant. An area of the light guiding channel 1226 resisting the light emitting surface 1222 is greater than an area of the light channel 1226 resisted with the light incident surface 1220. A projection of the light emitting surface 1222 on the light incident surface 1220 covers the periphery display region 112 and the non-display region 114, thus the image compensating portion 122 extends an image covering region of the periphery display region 112 to cover an area combined by upper regions of the periphery display region 112 and the non-display region 114. The light guiding channel 1226 and the light incident surface 1220 may define an acute angle, which is within a range of 30 degrees to 50 degrees. In at least one embodiment, the acute angle is 45 degree.

Figure 5:
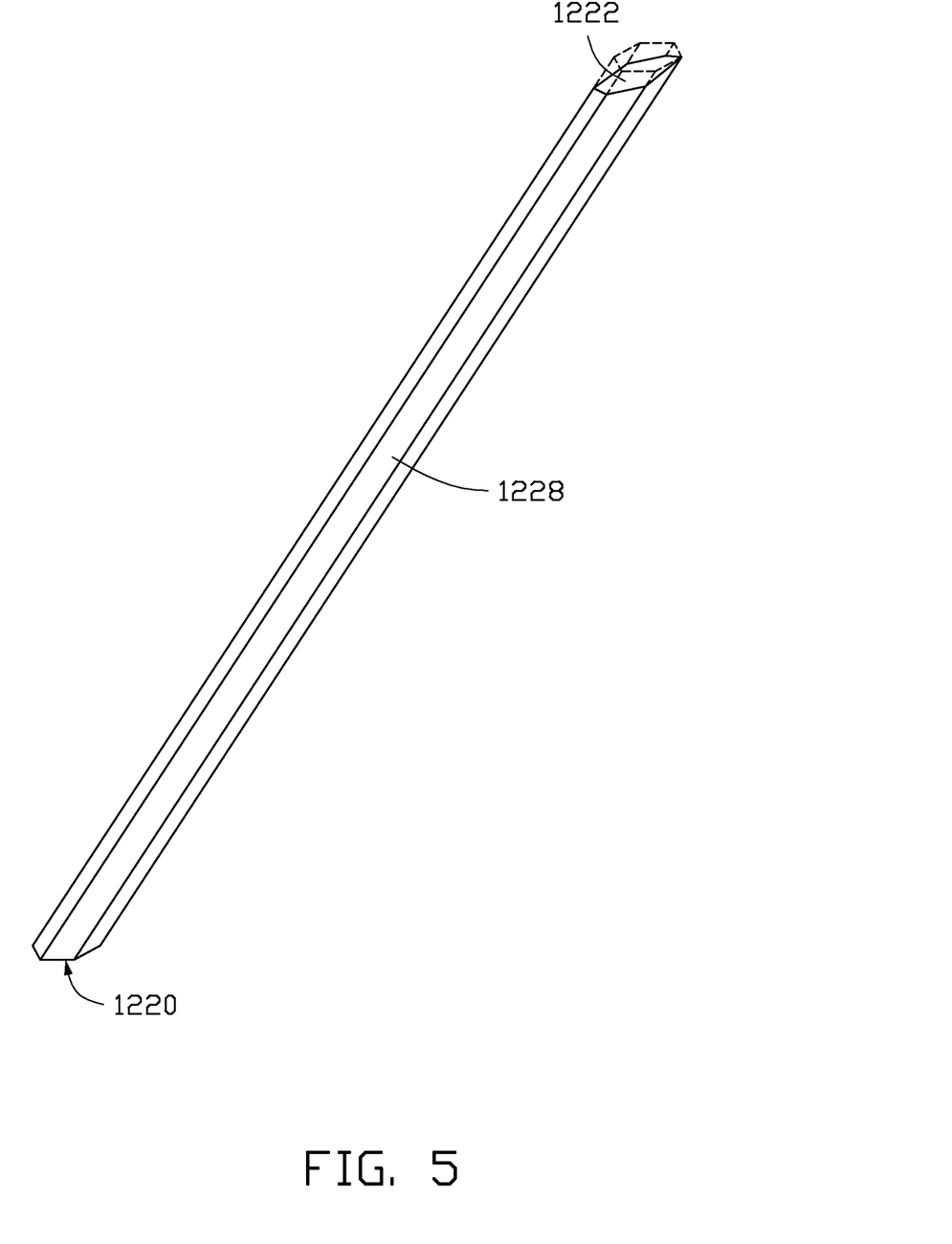
FIG. 5 is an isometric view of an embodiment of the light guiding channel of FIG. 4.

FIG. 5 illustrates that the light guiding light channel 1226 is a light guiding fiber 1228. Each of the light guiding fibers 1228 extends from the light incident surface 1220 to the light emitting surface 1222. The cross-sectional area of the light guiding fiber 1228 is constant (for example, diameters of the light guiding fiber 1228 from the light incident surface 1220 to the light emitting surface 1222 are constant). An area of the light guiding channel 1226 resisting the light emitting surface 1222 is greater than an area of the light channel 1226 resisted with the light incident surface 1220 for extending images displayed on the periphery display region 112. An extended degree of the images emitted by the light emitting surface 1222 is related to the arc light emitting surface 1222. In other embodiments, the light guiding channels 1226 can be combined with a number of optical fibers, light guiding thin plates, silica fibers, glass fibers, or other light penetrating material.

The supporting portion 123 includes a bottom surface 1230 resisting the non-display region 114, a first wall 1232 perpendicular to the bottom surface 1230, and a second wall 1234 interconnecting the bottom surface 1203 and the first wall 1232. The second wall 1234 angled with the first wall 1232 is coplanar to the first inclined surface 1224. The cross-sectional area of the supporting portion 123 is a right triangle. In at least one embodiment, the supporting portion 123 is made of a transparent material. The second wall 1234 is bonded with the first inclined surface 1224 via a colloid. Widths and heights of the image compensating portion 122 and the supporting portion 123 are related to widths and heights of the non-display region 114. The width of the supporting portion 123 is equal to the width of the non-display region 114. The width of the non-display region 114 is within a range of 1 millimeter (mm) to 5 mm. The width of the image compensating portion 122 is within a range of 5 mm to 15 mm. The heights of the image compensating portion 122 and the supporting portion 123 are within a range of 0.5 mm to 5 mm. In other embodiments, the supporting portion 123 is made of a non-transparent or opaque metal or plastic material.

In this embodiment, a portion of the periphery display region 112a includes a plurality of light guiding fiber 1228. An axis of the light guiding channel 1226 and the light incident surface 1220 can define an acute angle, which is within a range of 30 degrees to 50 degrees. The obtuse angle defined by the light incident surface 1220 and the first inclined surface 1224 is 135 degrees. In at least one embodiment, the acute angle is 45 degrees. The width of the periphery display region 112b, the corresponding non-display region 114, the corresponding image compensating portion 122, and the corresponding supporting portion 123 are parallel with the direction X. The width of the periphery display region 112b, the corresponding non-display region 114, the corresponding image compensating portion 122, and the corresponding supporting portion 123 are parallel with the direction Y. The height of the periphery display region 112b, the corresponding non-display region 114, the corresponding image compensating portion 122, and the corresponding supporting portion 123 are parallel with the direction Z.

Light from the periphery display region 112 emits into the image compensating portion 122, the image compensating portion 122 extends an image displayed by the pixels 116 in the periphery display region 112 to cover both of the corresponding periphery display region 112 and the corresponding non-display region 114. Based on the area and distance between different pixels 116 in the main display region 110 and the periphery display region 112, the extended image of the periphery display region 112 is equal to an image displayed by the main display region 110. When viewing the display 10, an image covering region of the periphery display region 112 is extended by the image compensating portion 122 while in use, and the display 10 has a zero border effect.

Figure 6:
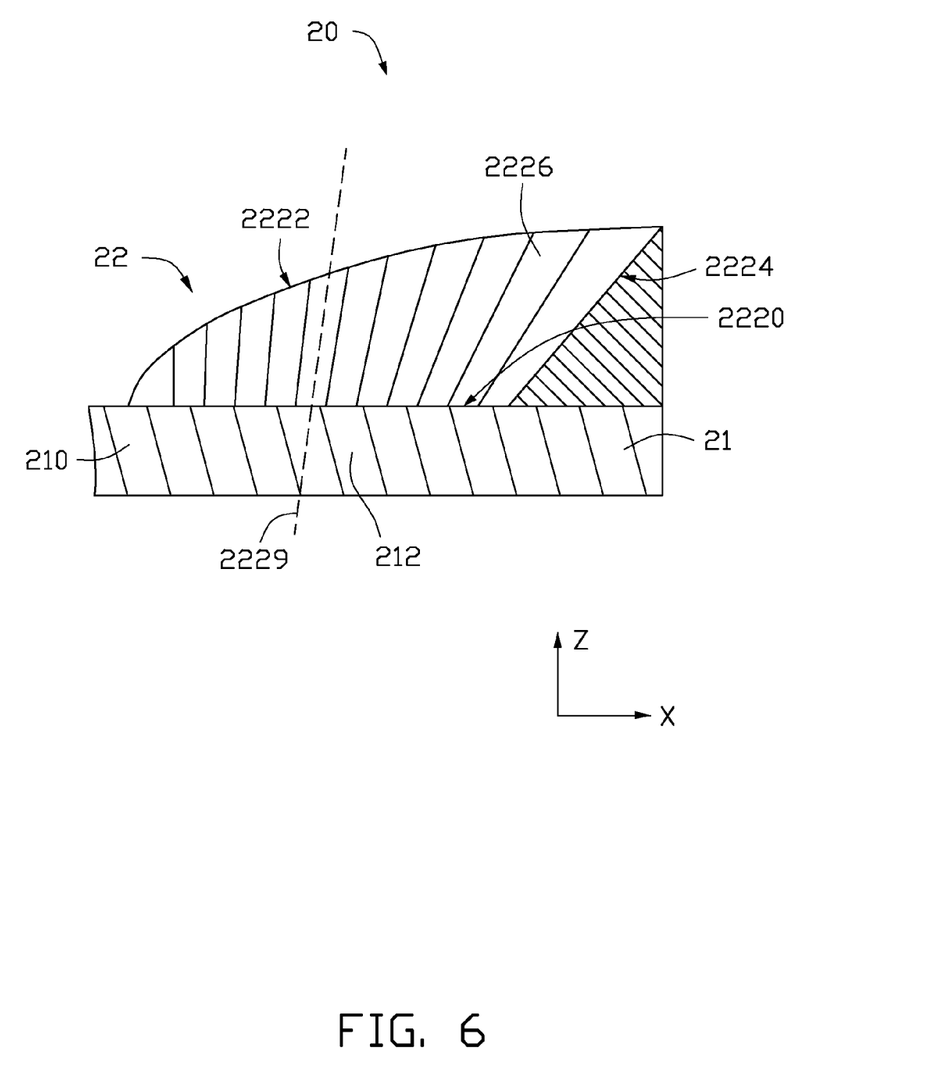
FIG. 6 is a cross-sectional view of another embodiment of the display of FIG. 2, taken along a line IV-IV thereof.

FIG. 6 illustrates another embodiment of the display 20. Cross sections of the light guiding channels 2226 gradually elevate from the light incident surface 2220 to the light emitting surface 2222. Each axis 2229 of the light guiding channels 2226 and the light incident surface 2220 define an angle within a range of 30 degrees to 90 degrees. The angles defined by different axes of the light guiding channels 2226 and the light incident surface 2220 gradually elevated along a direction from the periphery display region 212 to the main display region 210. The angle between the light guiding channel 2226 adjacent to the inclined surface 2224 and the light incident surface 2220 is 30 degrees, and the angle between the light guiding channel 2226 adjacent to the main display region 210 is 90 degrees. In other embodiments, the inclined surface 2224 and the light incident surface 2220 defines an angle of 135 degrees. The light guiding channel 2226 adjacent to the inclined surface 2224 and the light incident surface 2220 is 45 degrees. In at least one embodiment, areas of projections of the light guiding channels 2226 on the light incident surface 2220 gradually elevated.

Figure 7:
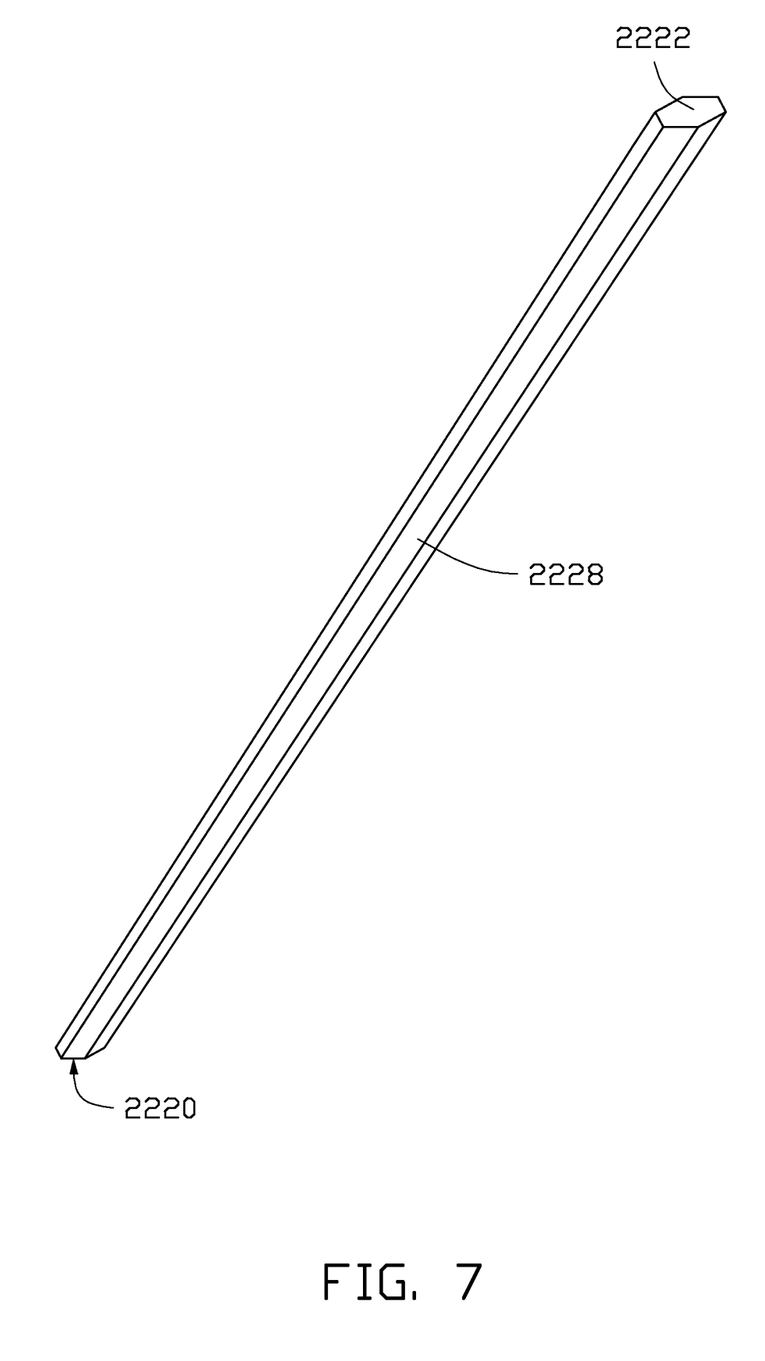
FIG. 7 is an isometric view of an embodiment of the light guiding channel of FIG. 6.

FIG. 7 illustrates that cross-sections of the light guiding fiber 1228 gradually elevated along a direction from the light incident 2220 to the light emitting surface 2222. An area of a projection of the light guiding channel 2228 on the light emitting surface 2222 is greater than an area of a projection of the light guiding channel 2228 on the light incident surface 2220.

Figure 8:
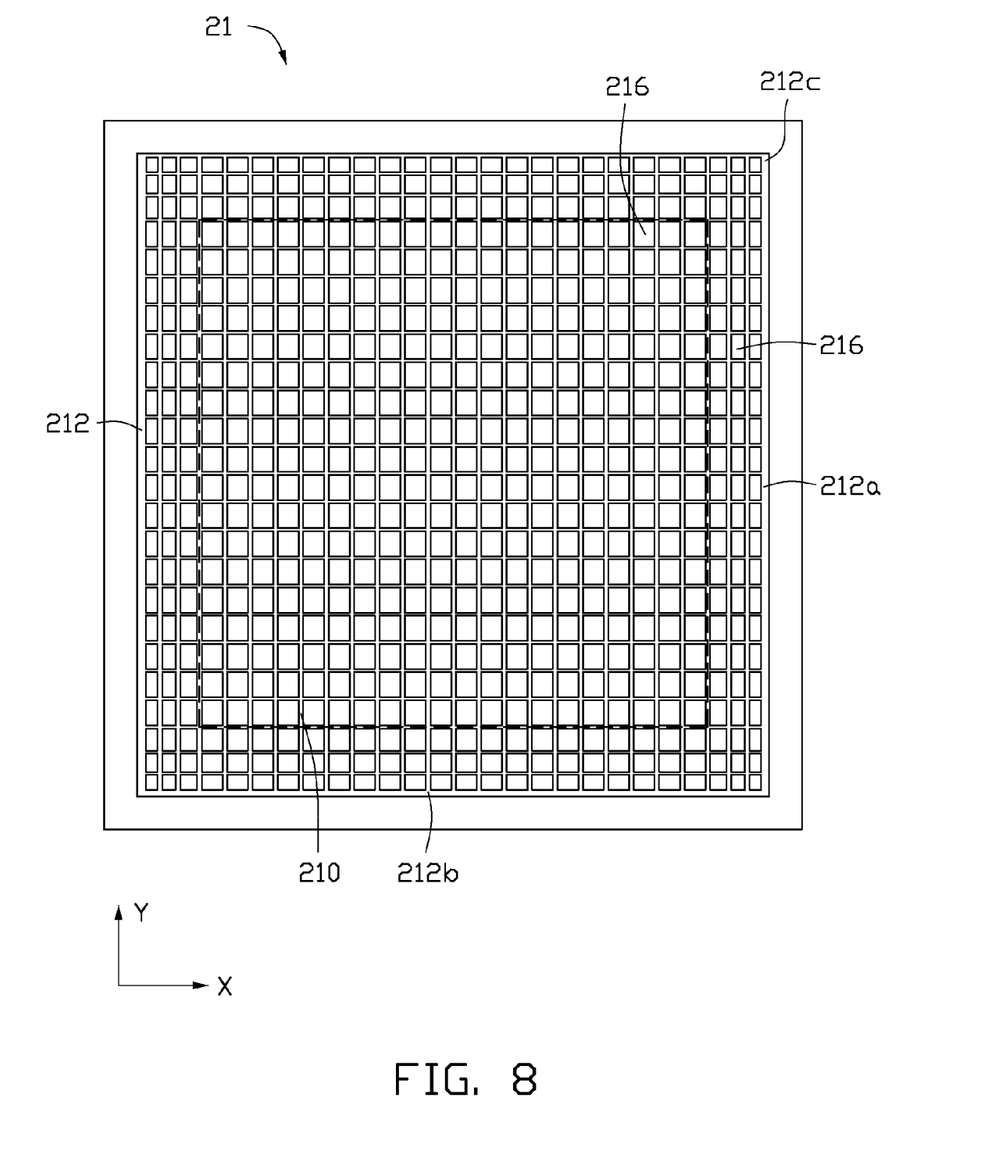
FIG. 8 is a diagrammatic view of an embodiment of the display of FIG. 6.

FIG. 8 illustrates that a distance between the adjacent pixels 216 in the main display region 210 are constant. A pixel density of the main display region 210 is less than a pixel density of the periphery display region 212. The constant distance of the pixels 216 in the main display region 210 is equal to or greater than the constant distance of the pixels 216 in periphery display region 212, and the constant area of the pixel 216 in the periphery display region 212 is less than the constant area of the pixel 216 in the main display region 210. In at least one embodiment, a length of the pixel 216 in the periphery display region 212a located on a right side and a left side of the main display region 210 is less than a length of the pixel in the main display region 210. A length of the pixel 216 in the periphery display region 212b located on an upper side and a lower side of the main display region 210 is less than a length of the pixel in the main display region 210. A length of the pixel 216 in the periphery display region 212c located at corners is less than a length of the pixel in the main display region 210. The length of the pixel 216 is parallel with a direction X, and the width of the pixel 216 is parallel with a direction Y perpendicular to the direction X.

The pixel density of the periphery display region 212 gradually elevates along a direction away from the main display region 210. The pixel density of the periphery display region 212a gradually elevates along a direction X. The pixel density of the periphery display region 212a gradually elevates along a direction Y. Distances between the adjacent pixels in the periphery display region 212 gradually decrease along a direction away from the main display region 210. Lengths of pixels in the periphery display region 212a gradually decrease along a direction away from the main display region 210. Widths of the pixels in the periphery display region 212b gradually decrease along a direction away from the main display region 210. In at least one embodiment, lengths and the width of the pixel 216 in the periphery display region 212c are decreased along a direction away from the main display region 210.

In a third embodiment, sizes of pixels 216 in the periphery display region 212 are gradually decreased along a direction away from the main display region 210. Ratios between an area of the light guiding channel 2226 projected on the light emitting surface 2222 and an area of the light guiding channel 2226 projected on the light incident surface 2220 gradually elevate to keep the pixels 216 in the periphery display region 210 constant after compensating.

Figure 9:
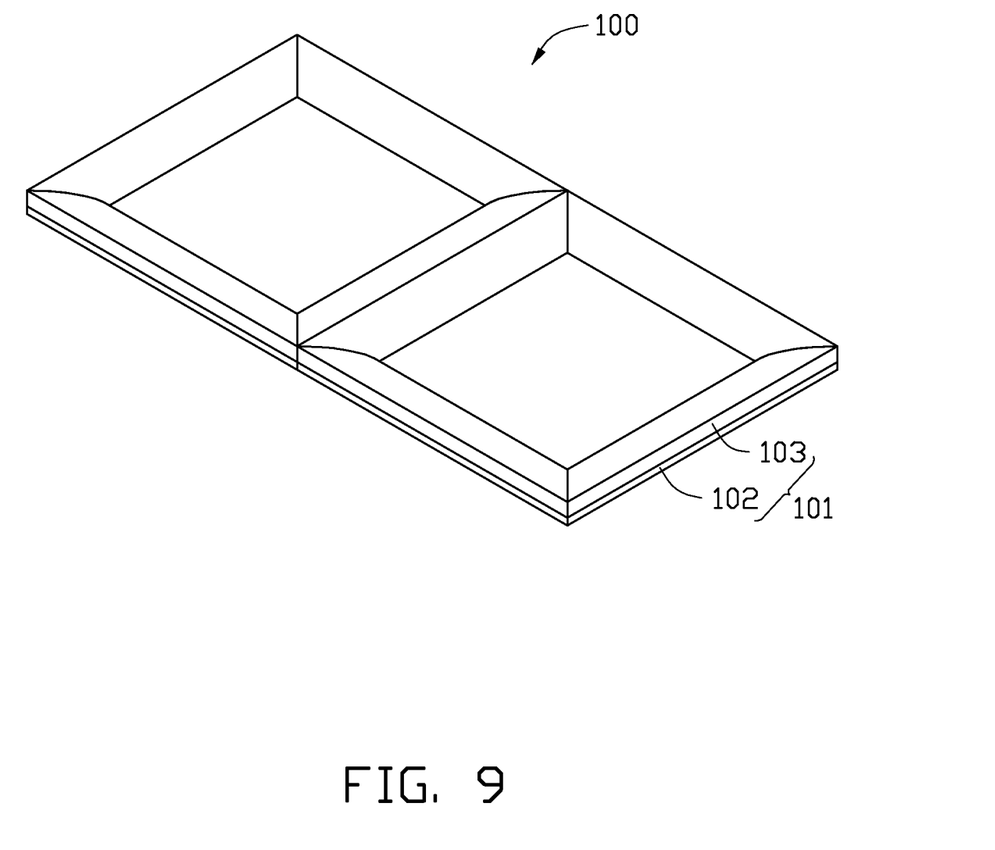
FIG. 9 is an isometric view of a first embodiment of the display assembly jointed by two displays of FIG. 1.
Figure 10:
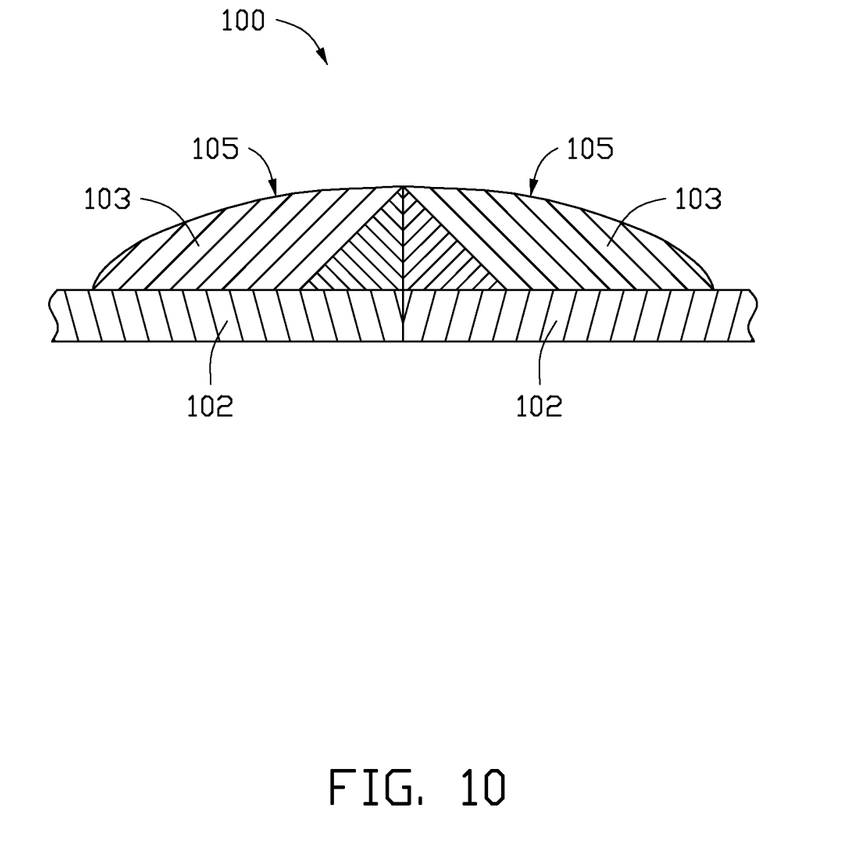
FIG. 10 is a diagrammatic view of an embodiment of the display of FIG. 9.

FIGS. 9-10 illustrate the display assembly 100 with two displays 101 jointed together. The display 101 includes a display panel 102 and an image compensating apparatus 103 located on the display panel 102. The structure of the display 101 is equal to the structure of the display 10. The light emitting surfaces 105 of each of the image compensating apparatuses 103 are connected, and the display panels 102 are connected for jointing the display 101. In other embodiments, the image compensating apparatus 103 of the display assembly 100 are only located on a joint of the displays 101 for covering the non-display region 107 on the joint of the display assembly 100. An image covering region of display apparatus 100 is extended, and the display apparatus 100 has a frame-less effect.

Figure 11:
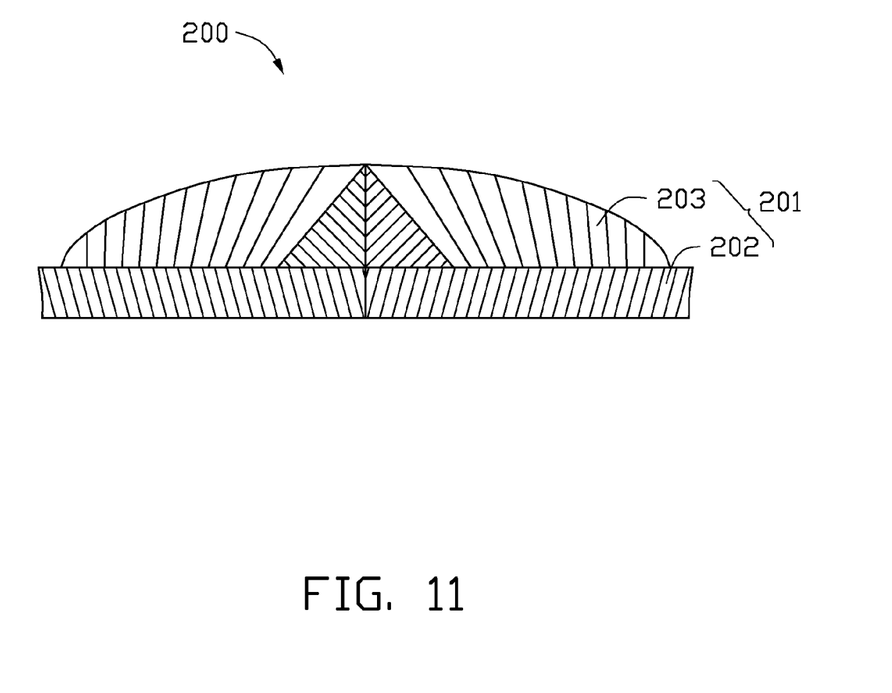
FIG. 11 is a diagrammatic view of another embodiment of the display assembly jointed by two displays of FIG. 6.

FIG. 11 illustrates the display assembly 200 with two displays 201 jointed together. The display 201 includes a display panel 202 and an image compensating apparatus 203 located on the display panel 202. The structure of the display 201 is equal to the structure of the display 20.

In use, the image compensating apparatus 12 extends an image covering region of the display 10 for covering the non-display region 114, thus frames of the display 10 are invisible and the visual effect of the display 10 is improved The embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims.

What is claimed is:

1. An image compensating apparatus located on a display panel, the image compensating apparatus comprising:
    an image compensating portion comprising a light incident surface, a light emitting surface, and a plurality of light guiding channels connected with the light incident surface and the light emitting surface, wherein a projection of the light emitting surface on the light incident surface is larger than an area of the light incident surface, and wherein each light guiding channel guides light from the light incident surface to be emitted from the light emitting surface for being extended;

wherein each of the light guiding channels is a frustum cone shaped, the image compensating portion extends an image that is displayed on the edges of the display panel, wherein angles, defined by different central axes of the light guiding channels and the light incident surface, are gradually elevated along a direction from a periphery display region to a main display region surrounded by the periphery display region.

2. The image compensating apparatus of claim 1, wherein the light emitting surface connected with the light incident surface is substantially arc shaped and protrudes outwardly away from the light incident surface.

3. The image compensating apparatus of claim 1, wherein the image compensating portion further comprises an inclined surface connected to the light incident surface and the light emitting surface, wherein the angle defined between the inclined surface and the light incident surface is an obtuse angle.

4. The image compensating apparatus of claim 3, wherein the angle defined by the light incident surface and the light inclined surface is within 130 degrees to 150 degrees.

5. The image compensating apparatus of claim 1, wherein cross-sections of each light guiding channel are gradually elevated along a direction away from the light incident surface.

6. The image compensating apparatus of claim 1, wherein the display panel comprises a main display region and a periphery display region corresponding to the image compensating portion, wherein the light guiding channel guides lights from the light incident surface to the light emitting surface to be emitted for extending an image covering region of the periphery display region.

7. The image compensating apparatus of claim 6, wherein the display panel further comprises a non-display region, wherein the periphery display region is positioned between the main display region and the non-display region, wherein the image compensating portion extends an image displayed on the periphery display region to cover an area combined by upper regions of the periphery display region and the non-display region.

8. The image compensating apparatus of claim 6, wherein the main display region and the periphery display region respectively comprise a plurality of pixels, wherein an average pixel density of the main display region is less than an average pixel density of the periphery display region.

9. The image compensating apparatus of claim 8, wherein the pixel density of the periphery display region are gradually elevated along a direction away from the main display region.

10. The image compensating apparatus of claim 8, wherein a distance between adjacent pixels in the periphery display region is less than a distance between adjacent pixels in the main display region.

11. The image compensating apparatus of claim 1, further comprising a detached supporting portion, wherein the supporting portion set on the non-display region supports the image compensating portion.

12. A display assembly comprising:
at least two displays arranged in parallel;
wherein each of the at least two displays comprises a display panel and an image compensating apparatus with an image compensating portion, wherein the display panel comprises a main display region and a periphery display region corresponding to the image compensating portion, and wherein the image compensating portion comprises a light incident surface, a light emitting surface, and a plurality of light guiding channels connected with the light incident surface and the light emitting surface, wherein a projection of the light emitting surface on the light incident surface is larger than an area of the light incident surface, wherein the light guiding channel guides lights from the light incident surface to be emitted from the light emitting surface for extending an image covering region of the periphery display region; and
wherein each of the light guiding channels is a frustum cone shaped, the image compensating portion extends an image that is displayed on the edges of the display panel, wherein angles, defined by different central axes of the light guiding channels and the light incident surface, are gradually elevated along a direction from a periphery display region to a main display region surrounded by the periphery display region.

13. The display assembly of claim 12, wherein the light emitting surface connected with the light incident surface is substantially arc shaped, and is protruded outwardly away from the light incident surface.

14. The display assembly of claim 12, wherein cross: sections of the light guiding channel are gradually elevated along a direction away from the light incident surface.

15. The display assembly of claim 12, wherein the image compensating apparatuses are jointed together, wherein the light guiding channel guides lights from the light incident surface to the light emitting surface to be emitted for extending an image covering region of the periphery display region.

* * * * *